(12) United States Patent　　(10) Patent No.: US 8,358,510 B2
Chen et al.　　(45) Date of Patent: Jan. 22, 2013

(54) POWER DISTRIBUTION APPARATUS

(75) Inventors: Yang-Yuan Chen, Tu-Cheng (TW); Heng-Chen Kuo, Tu-Cheng (TW)

(73) Assignee: Hon Hai Precision Industry Co., Ltd., New Taipei (TW)

( * ) Notice: Subject to any disclaimer, the term of this patent is extended or adjusted under 35 U.S.C. 154(b) by 226 days.

(21) Appl. No.: 12/875,173

(22) Filed: Sep. 3, 2010

(65) Prior Publication Data

US 2011/0261545 A1　Oct. 27, 2011

(30) Foreign Application Priority Data

Apr. 27, 2010　(TW) ................................ 99207630 U

(51) Int. Cl.
*H05K 1/11*　　(2006.01)

(52) U.S. Cl. ....................................... 361/784; 361/792

(58) Field of Classification Search .................. 361/784, 361/792, 819, 679.4, 760; 174/527, 559; 439/949, 76.2, 620.27
See application file for complete search history.

(56) References Cited

U.S. PATENT DOCUMENTS

| | | | | |
|---|---|---|---|---|
| 5,709,957 | A | * | 1/1998 | Chiang et al. ................ 428/615 |
| 7,252,519 | B2 | * | 8/2007 | Saka ............................. 439/76.2 |
| 2006/0141822 | A1 | * | 6/2006 | Ozawa et al. ................ 439/76.1 |
| 2006/0209475 | A1 | * | 9/2006 | Cabrera et al. ................... 361/1 |
| 2008/0105460 | A1 | * | 5/2008 | Kasai ............................ 174/527 |
| 2009/0323301 | A1 | * | 12/2009 | Gibbons et al. .............. 361/819 |
| 2010/0020479 | A1 | * | 1/2010 | Chen et al. ................. 361/679.4 |

* cited by examiner

*Primary Examiner* — Yuriy Semenenko
(74) *Attorney, Agent, or Firm* — Altis Law Group, Inc.

(57) ABSTRACT

A power distribution apparatus includes an outlet board, a fuse board, and at least one connector. The outlet board is connected to the fuse board through the at least one connector.

5 Claims, 3 Drawing Sheets

POWER DISTRIBUTION APPARATUS

BACKGROUND

1. Technical Field

The present disclosure relates to power distribution apparatus.

2. Description of Related Art

Power distribution apparatuses have long been utilized to supply power to loads. One particular power distribution apparatus includes an outlet board and a fuse board. A plurality of sub output terminals are located on the outlet board. The power distribution apparatus allocates input power supply to each sub output terminal. The fuse board includes a plurality of fuses corresponding to the sub output terminals. If the current of the sub output terminal is higher than the fusing current of the corresponding fuse, the corresponding fuse blows to protect circuit elements.

The outlet board is electrically connected to the fuse board through cables. Generally, one sub output terminal needs two cables to connect to the fuse board. With more sub output terminals, the power distribution apparatus needs more cables. More cables easily lead to connection errors. When the load needs high operating current, the cables must be thick enough to withstand the high operating current, and conductive leads on the outlet board and the fuse board must be wide enough to withstand the high operating current. Therefore, the size of the power distribution apparatus may be increased.

Thus, there is room for improvement within the art.

BRIEF DESCRIPTION OF THE DRAWINGS

Many aspects of the present disclosure can be better understood with reference to the following drawings. The components in the various drawings are not necessarily drawn to scale, the emphasis instead being placed upon clearly illustrating the principles of the present power distribution apparatus.

DETAILED DESCRIPTION

Figure 1:
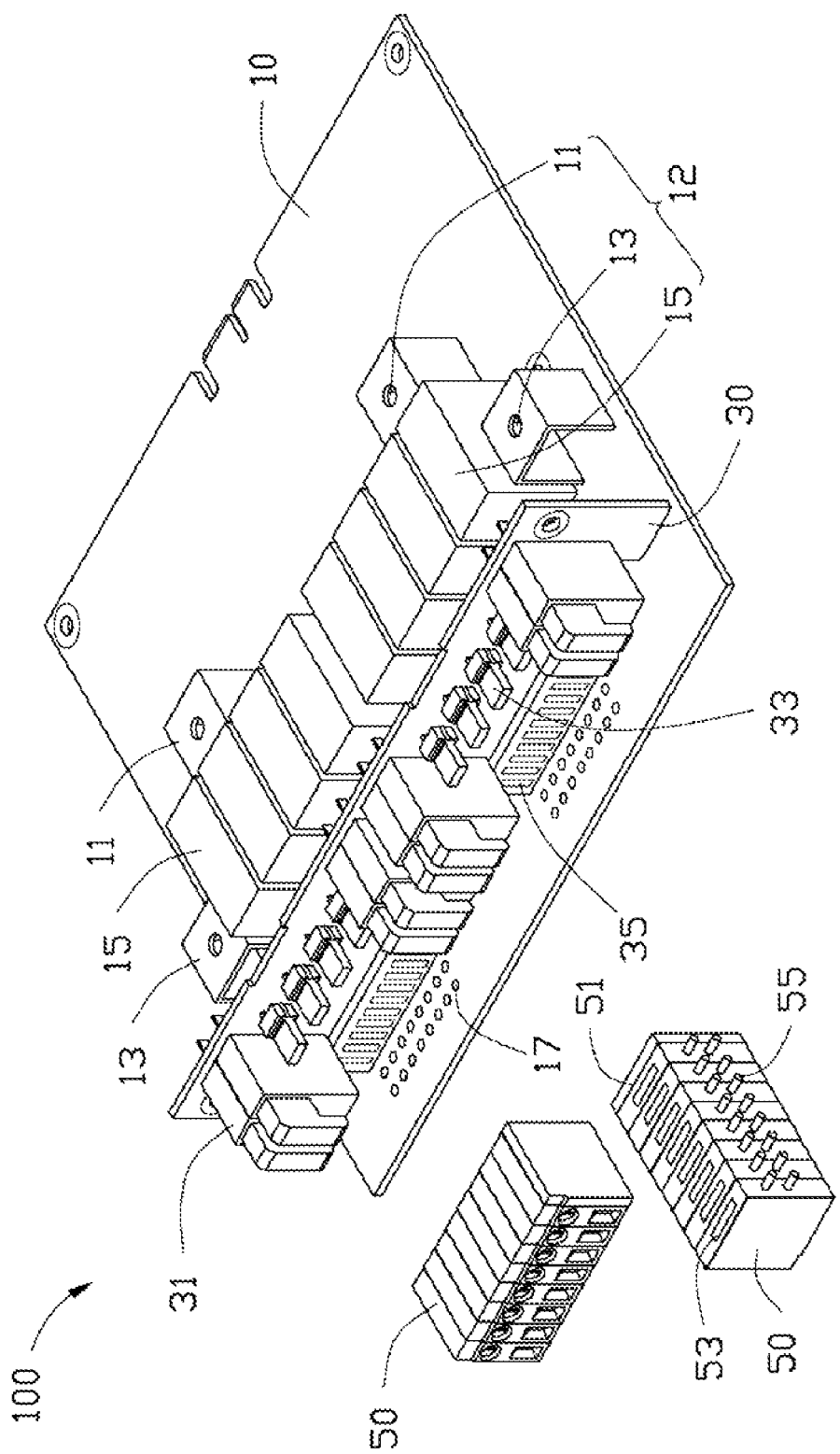
FIG. 1 is a disassembled view of a power distribution apparatus according to an exemplary embodiment.

Referring to FIG. 1, a one-input, eight-output power distribution apparatus 100 is taken as an exemplary embodiment. The power distribution apparatus 100 includes an outlet board 10, a fuse board 30 and two connectors 50. The outlet board 10 is electrically connected to the fuse board 30 through the two connectors 50. Both the outlet board 10 and the fuse board 30 are printed circuit boards plated with copper foil, and the thickness of the copper foil is 2 ounces.

An interface unit 12 is located on the outlet board 10. The interface unit 12 includes a power input terminal 11, a ground terminal 13, and eight sub power output terminals 15. A plurality of solder joints 17 are located on one edge of the outlet board 10. The two connectors 50 are electrically connected to the outlet board 10 through the solder joints 17.

The fuse board 30 includes eight fuses 31, eight indicator lights 33, and two welding areas 35. Each indicator light 33 is corresponding to one fuse 31. The eight fuses 31 are parallel to each other. Each fuse 31 is electrically connected to one corresponding sub power output terminal 15. Each connector 50 is electrically connected to the fuse board 30 through one welding area 35.

The connector 50 includes a side surface 51, and a plurality of contact points 53 are located on the side surface 51. A plurality of pins 55 are located on the bottom surface of the connector 50. The pins 55 are for corresponding to the solder joints 17.

Figure 2:
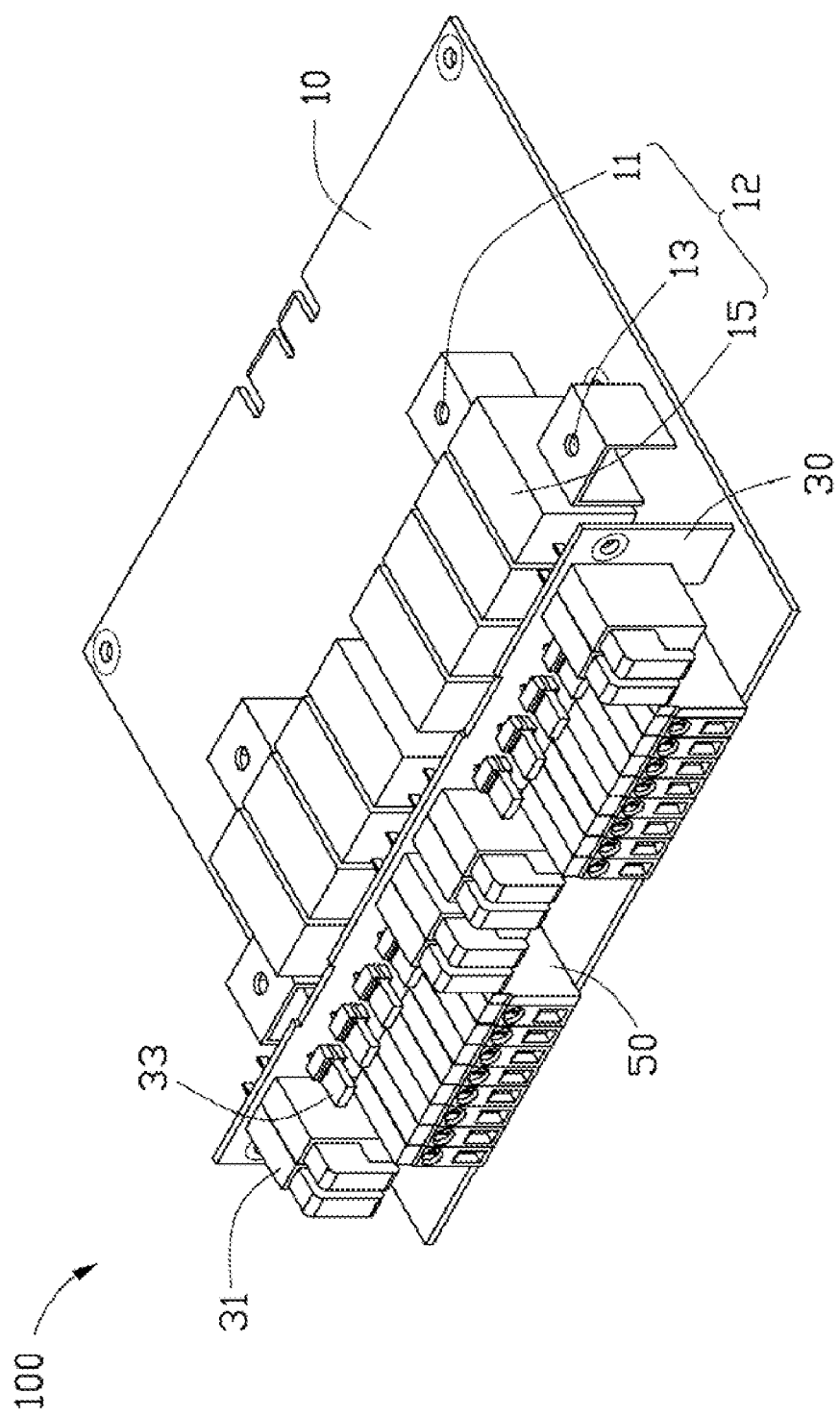
FIG. 2 is an assembled view of the power distribution apparatus shown in FIG. 1.

Referring to FIG. 2, the assembly process of the power distribution apparatus 100 is as follows: The contact points 55 of each connector 50 are welded on the corresponding welding area 35. Thus, the connector 50 is electrically connected to the fuse board 30. The plurality of pins 55 are welded on the outlet board 10 through the solder joints 17.

Figure 3:
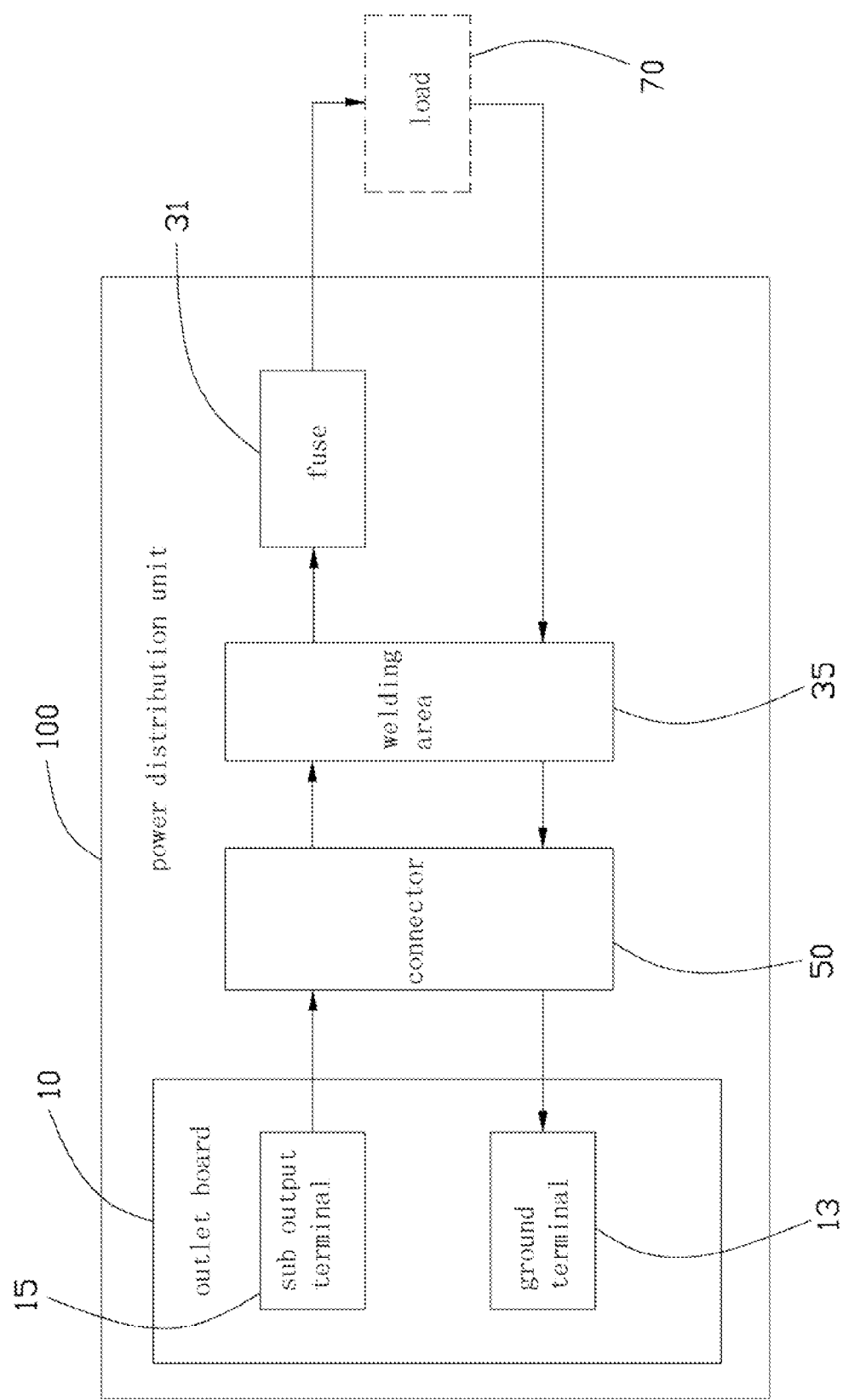
FIG. 3 is a block diagram of the power distribution apparatus shown in FIG. 1.

Referring to FIG. 3, the operating current trend of the power distribution apparatus 100 is as follows: Power supply is input into the power distribution apparatus 100 through the power input terminal 11. The power distribution apparatus 100 allocates the power supply to each sub output terminal 15. The current of the sub power output terminal 15 is input into the fuse board 30 through the connector 50. If the current of the sub power output terminal 15 is lower than the fusing current of the corresponding fuse 31, the current of the sub power output terminal 15 is input into load 70 through the corresponding fuse 31. If the current of the sub power output terminal 15 is higher than the fusing current of the corresponding fuse 31, the corresponding fuse 31 blows, and the indicator light 33 corresponding to the fuse 31 changes from bright to dark or dark to bright.

As detailed above, the outlet board 10 is electrically connected to the fuse board 30 through the connectors 50, the power distribution apparatus 100 is easy to assemble. The thickness of the copper foil is 2 ounces, when carrying same current, the width of the conductive leads on the outlet board and the fuse board is at half of conductive leads of prior art.

The connector 50 may be a PCI-E (Peripheral Component Interconnection Express) X8.

The quantity of connectors 50 can be adjusted according to actual conditions.

It is to be further understood that even though numerous characteristics and advantages of the present embodiments have been set forth in the foregoing description, together with details of structures and functions of various embodiments, the disclosure is illustrative only, and changes may be made in detail, especially in matters of shape, size, and arrangement of parts within the principles of the present disclosure to the full extent indicated by the broad general meaning of the terms in which the appended claims are expressed.

What is claimed is:

1. A power distribution apparatus, comprising:
    an outlet board,
    a fuse board, and
    at least one connector including a plurality of contact points and a plurality of pins,
    wherein a plurality of solder joints are located on the outlet board; the fuse board includes at least one welding area for welding with the at least one connector; the plurality of contact points are welded on the welding area, and the plurality of pins are welded on the outlet board through the plurality of solder joints.

2. The power distribution apparatus as claimed in claim 1, wherein the outlet board includes an interface unit, the interface unit includes a power input terminal, a ground terminal, and a plurality of sub power output terminals, power supply is input into the power distribution apparatus through the power input terminal, and the power distribution apparatus allocates the power supply to each sub output terminal.

3. The power distribution apparatus as claimed in claim 2, wherein the fuse board includes a plurality of fuses, each fuse is electrically connected to one sub output terminal through the at least one connector.

4. The power distribution apparatus as claimed in claim 1, wherein the at least one connector is PCI-E X8.

5. The power distribution apparatus as claimed in claim 1, wherein both the outlet board and the fuse board are printed circuit boards plating copper foil, and the thickness of the copper foil is 2 ounces.

* * * * *